(12) United States Patent
Reichenbach et al.

(10) Patent No.: US 7,495,328 B2
(45) Date of Patent: Feb. 24, 2009

(54) MICROMECHANICAL COMPONENT

(75) Inventors: Frank Reichenbach, Wannweil (DE); Freider Haag, Wannweil (DE); Arnd Kaelberer, Schlierbach (DE)

(73) Assignee: Robert Bosch GmbH, Stuttgart (DE)

( * ) Notice: Subject to any disclaimer, the term of this patent is extended or adjusted under 35 U.S.C. 154(b) by 190 days.

(21) Appl. No.: 11/493,702

(22) Filed: Jul. 24, 2006

(65) Prior Publication Data

US 2007/0040230 A1    Feb. 22, 2007

(30) Foreign Application Priority Data

Aug. 17, 2005   (DE) ................. 10 2005 038 755

(51) Int. Cl.
*H01L 23/22* (2006.01)
*H01L 23/24* (2006.01)

(52) U.S. Cl. .............. 257/687; 257/724; 257/787; 257/E23.116; 257/E23.128

(58) Field of Classification Search ........ 257/687, 257/666, 724, 728, 787, E23.116, E23.128; 438/126

See application file for complete search history.

(56) References Cited

U.S. PATENT DOCUMENTS

| | | | | |
|---|---|---|---|---|
| 5,984,162 A | * | 11/1999 | Hortaleza et al. | 228/110.1 |
| 5,998,243 A | * | 12/1999 | Odashima et al. | 438/127 |
| 6,028,368 A | * | 2/2000 | Abe | 257/787 |
| 2002/0050630 A1 | * | 5/2002 | Tiziani et al. | 257/666 |
| 2007/0272993 A1 | * | 11/2007 | Haag et al. | 257/434 |
| 2007/0288139 A1 | * | 12/2007 | Schillinger et al. | 701/36 |

FOREIGN PATENT DOCUMENTS

DE    195 37 814    5/1997

OTHER PUBLICATIONS

Micromachining and Microfabrication Process Technology VI, Proceedings of SPIE vol. 4174 (2000) pp. 377-387.

* cited by examiner

*Primary Examiner*—Hoai v Pham
(74) *Attorney, Agent, or Firm*—Kenyon & Kenyon LLP

(57) ABSTRACT

A micromechanical component has a structure such that a material flow is guided from at least one preferred direction for the purpose of uniformly enveloping the micromechanical component.

19 Claims, 3 Drawing Sheets

MICROMECHANICAL COMPONENT

FIELD OF THE INVENTION

The present invention relates to a micromechanical component having a structure such that a material flow is guided from at least one preferred direction for the purpose of uniformly enveloping the micromechanical component.

BACKGROUND INFORMATION

German patent application DE 195 37 814 A1 discusses the structure of a sensor-layer system and a method for hermetically packaging sensors in surface micromechanics. The manufacture of the sensor structure is based on available technological methods. Capping is accomplished using a separate silicon cap wafer which is structured using elaborate structuring processes such as KOH etching, for example. The sensor cap is applied to the sensor wafer on the wafer level using a glass solder. For this purpose, a wide bond frame is provided on the edge of each sensor chip to ensure adequate bonding and tightness of the cap.

According to the related art, the sensor element is mounted on a lead frame, contacted using gold wires and sheathed using a known injection molding method. In sheathing, the molding compound, liquid plastic for example, flows from the sprue into a hollow mold containing the element to be sheathed.

The thickness and shape of the sensor prove to be disadvantageous in sheathing. This results in an uneven flow and consequently an irregular filling of the cavity above and below the sensor element and to turbulence of the molding compound behind the sensor. These effects may cause undesirable gas bubbles to be enclosed in the molding compound. V. Motta et al. discussed this effect in Micromachining and Microfabrication Process Technology VI, Proceedings of SPIE vol. 4174 (2000) pp. 377-387.

An object was to find a possibility for avoiding air inclusions and turbulence of the molding compound behind the sensor.

SUMMARY OF THE INVENTION

The exemplary embodiment of the present invention relates to a micromechanical component having a structure such that a material flow is guided from at least one preferred direction for the purpose of uniformly enveloping the micromechanical component.

The exemplary micromechanical component according to the present invention guides the flow of a molding compound around the component in such a way that the injection mold is filled uniformly. As a result, it is possible to package the component largely without gas inclusions.

An exemplary embodiment of the present invention provides that the micromechanical component has a micromechanical element having a cap, the surface of which is favorable for the material flow from the at least one preferred direction. Advantageously, such a surface favors laminar flows and prevents turbulence and consequent gas inclusions in the material flow.

An exemplary embodiment of the present invention which is advantageous in particular provides that the cap has at least one beveled edge for guiding the material flow, in particular on a side facing away from the source of the material flow. Gas inclusions occur frequently at this location in particular and may be advantageously prevented by the specified measures.

Another exemplary embodiment of the present invention provides that the cap has at least one structured surface having grooves for guiding the material flow. Based on the known origin of the material flow, it is possible to guide it advantageously using the available flow cross section or even capillary forces.

In an analogous consideration, it is also advantageous that the micromechanical component has a lead frame having at least one structured surface for guiding the material flow.

Another exemplary embodiment of the present invention provides that the micromechanical component has a lead frame and the lead frame has at least one port for guiding the material flow. Advantageously, it is thus possible to fill a portion of the material flow into areas in the vicinity of the micromechanical component before gas inclusions are produced there by another portion of the material flow.

DETAILED DESCRIPTION

The invention will be elucidated in detail with reference to the embodiments described below.

Figure 1:
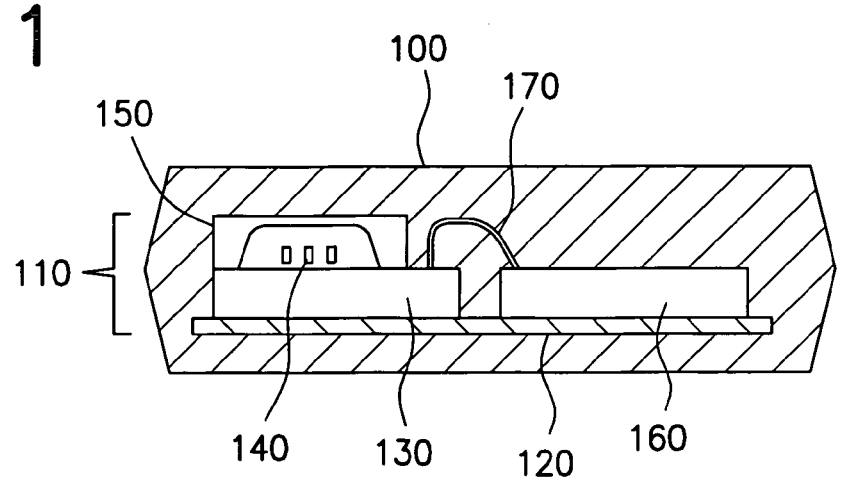
FIG. 1 shows the structure of a sheathed micromechanical sensor from the related art.
Figure 1:
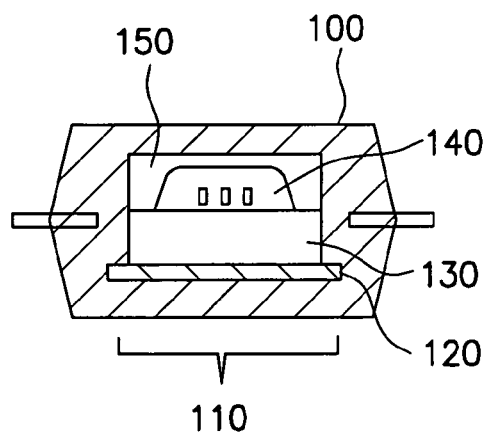

FIG. 1 shows the structure of a sheathed micromechanical sensor from the related art. First side view FIG. 1A shows an injection molded housing 100 having a component 110 within it. Component 110 includes a lead frame 120 having electronic and micromechanical elements mounted on it. In this example, a microelectronic circuit 160 and a micromechanical element 130 connected electrically by bonding wires 170 are situated on lead frame 120. Micromechanical element 130 has micromechanical functional elements 140 which are covered by a cap 150 placed over them. Second side view FIG. 1B shows injection molded housing 100, lead frame 120, micromechanical element 130 including its micromechanical functional elements 140 and cap 150 placed over them.

Figure 2:
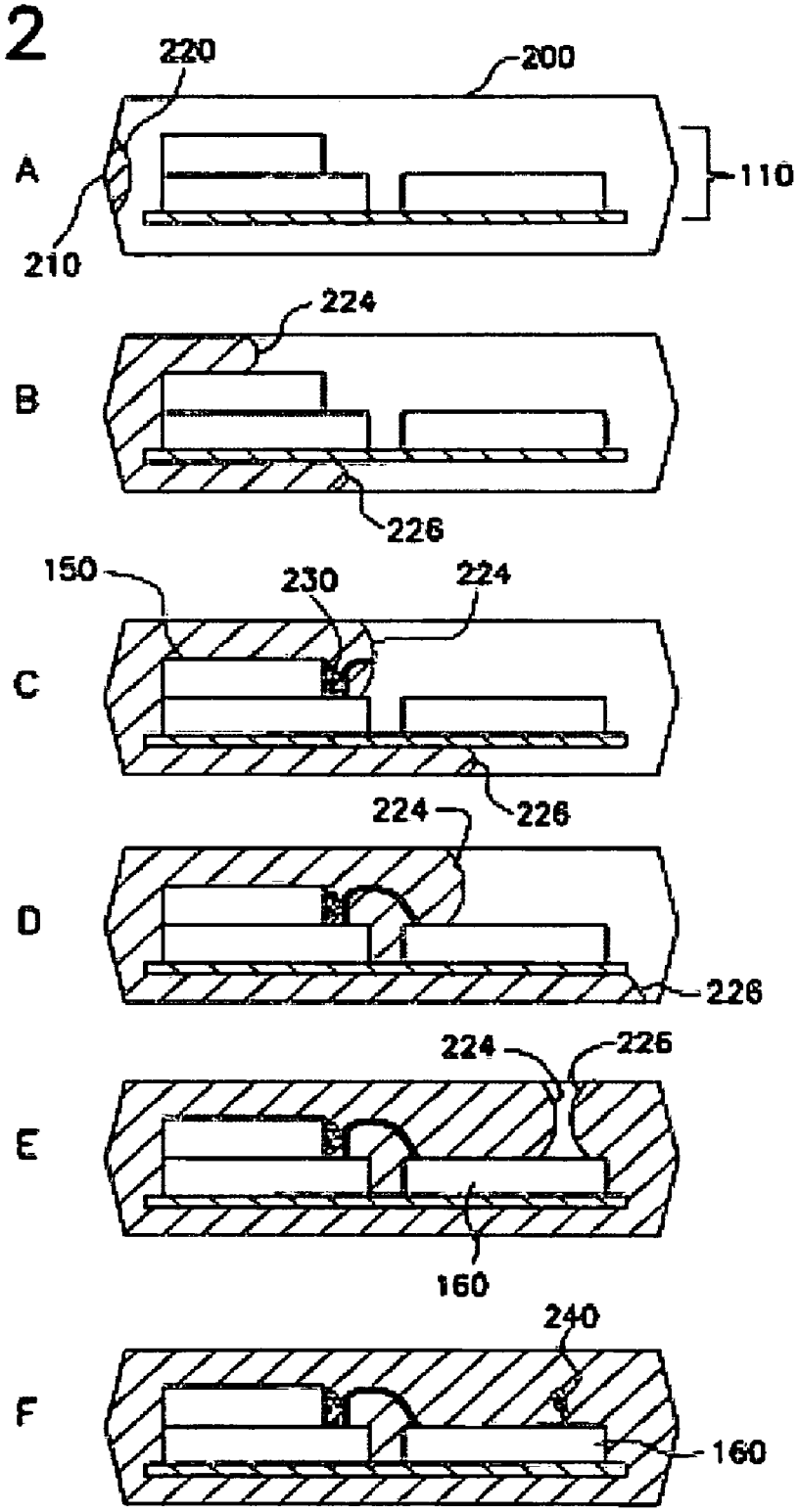
FIG. 2 shows the filling behavior of the injection molding compound when a micromechanical sensor is packaged according to the related art.

In subfigures A-F, FIG. 2 shows the filling behavior of the injection molding compound when a micromechanical sensor is packaged according to the related art. FIG. 2A schematically shows an injection mold 200 having a gating point 210, from which a material flow, i.e., a molding compound 220, flows into the mold. Component 110 is situated in injection mold 200. FIG. 2B shows the filling of molding compound 220 into injection mold 200. As a function of the position and shaping of component 110 in injection mold 200, molding occurs at varying rates in different areas. In the example shown here, filling produces a relatively slowly advancing upper molding compound front 224 and a lower molding compound front 226 which advances more rapidly relative thereto. FIG. 2C shows how initial gas inclusions 230 are formed during filling by turbulence of molding compound 220 behind cap 150. The further advance of molding compound fronts 224 and 226 is shown in FIGS. 2D and E. Due to the higher speed of lower molding compound front 226, it flows around microelectronic circuit 160 and meets upper molding compound front 224 above. As FIG. 2F shows, this produces second gas inclusions 240 above microelectronic circuit 160.

Figure 3:
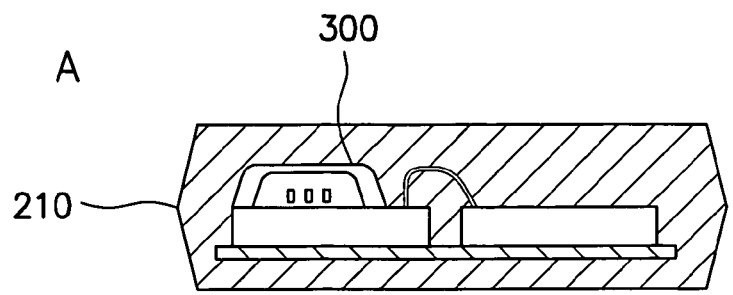
FIG. 3 shows a sensor according to the exemplary embodiment of the present invention having beveled edges on the cap.
Figure 3:
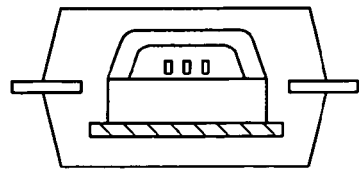

FIG. 3 shows a sensor according to the exemplary embodiment of the present invention having beveled edges on the cap. According to the exemplary embodiment of the present invention, the flow characteristics of component 110 are to be optimized compared to a material flow from at least one preferred direction. This makes it possible to reduce turbulence and accordingly the formation of first gas inclusions 230 in the vicinity of component 110. The embodiment having a beveled cap shape 300 shown here lowers the flow resistance to a material flow from the direction of gating point 210 and increases the surface having material effectively flowing through it. The beveling of the edges prevents or at least reduces a separation of the flow and accordingly the turbulence on the side of cap 300 facing away from gating point 210.

Figure 4:
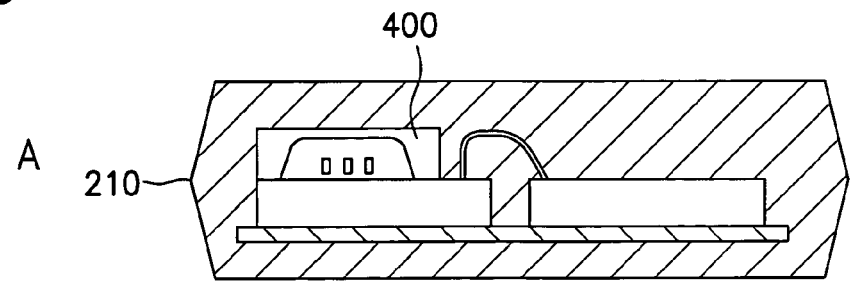
FIG. 4 shows a sensor according to the exemplary embodiment of the present invention having a structured cap surface.
Figure 4:
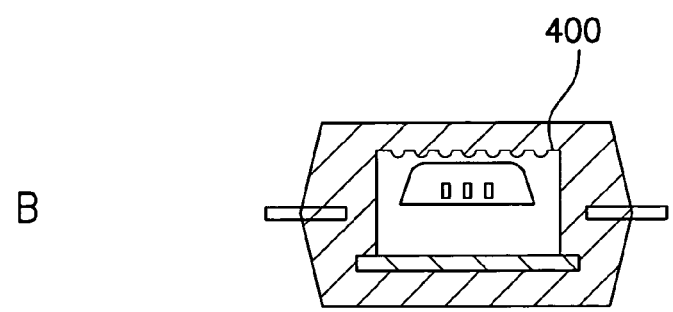

FIG. 4 shows a sensor according to the exemplary embodiment of the present invention having a structured cap surface. In this second exemplary embodiment, the flow resistance of the cap is reduced or even the capillary forces are utilized by structuring the cap surface. In FIGS. 4A and B, a component 110 having a structured cap 400 is shown. The top of cap 400 has grooves or furrows running essentially in the direction of a material flow emerging from gating point 210. The embodiment shown here having a structured cap 400 lowers the flow resistance to a material flow from the direction of gating point 210 and increases the surface having material effectively flowing through it. By utilizing capillary forces and changing the cross-sectional area, the material flow, such as, e.g., molding compound 220, is guided using furrows, grooves, or channels on the top of the cap. This is also possible on other surfaces of micromechanical component 110, in particular on lead frame 120.

Figure 5:
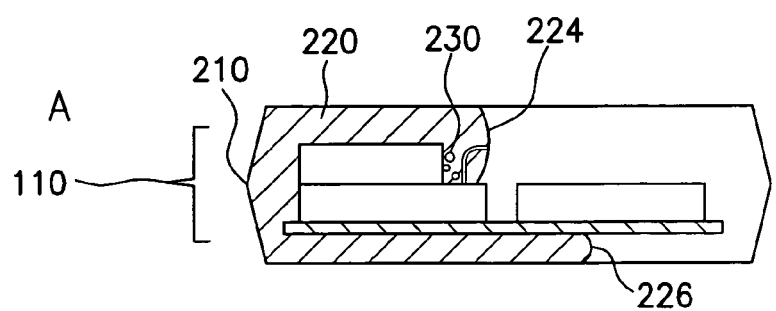
FIG. 5 shows a sensor according to the exemplary embodiment of the present invention having a port in the lead frame.
Figure 5:
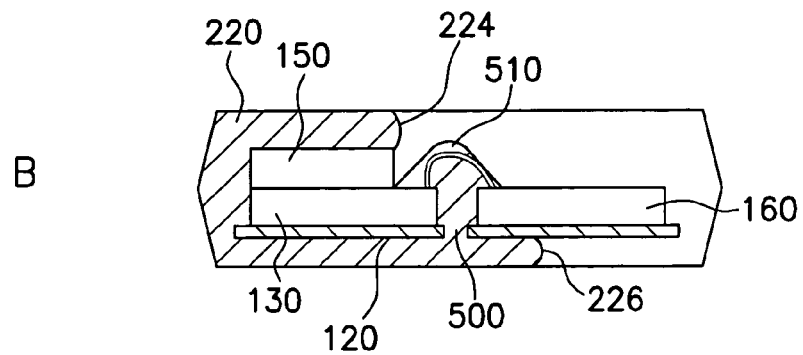

FIG. 5 shows a sensor according to the exemplary embodiment of the present invention having a port in the lead frame. FIG. 5A corresponds to the depiction in FIG. 2C. In comparison, FIG. 5B shows an embodiment of micromechanical component 110 according to the exemplary embodiment of the present invention having a port 500 in lead frame 120. Port 500 may be situated on the side of micromechanical element 130 facing away from gating point 210 and thus the source of the material flow. The rapidly advancing material flow in the lower area rapidly passes through this port 500 and forms an additional molding compound front 510. The area in which first gas inclusions 230 were formed previously, i.e., in the related art, has already been filled with molding compound 220 by the time slower upper molding compound front 224 arrives. It is thus no longer possible for gas inclusions to form there. Molding compound fronts 224, 226 and 510 meet at another location and thus prevent gas inclusions or shift them to an uncritical area distant from micromechanical component 110.

Appropriately placed ports 500 in lead frame 120 thus make it possible for molding compound fronts 224, 226 and 510 to merge at a suitable location. This location should be selected in such a way that gas inclusions are prevented or at least shifted to a location which is sufficiently distant from micromechanical component 110 that the gas inclusions no longer have an effect on micromechanical component 110. Furthermore, the suitable location for merging molding compound fronts 224, 226 and 510 may also be selected in such a way that a possibility for de-aeration exists at this location, for example, through ejector pins. Finally, by minimizing the area of lead frame 120 it is possible to maximize the cross section through which the material flow passes.

Further exemplary embodiments may also use the subject matter described herein.

What is claimed is:

1. A micromechanical component comprising:
   a structure such that a material flow is guided from at least one preferred direction to uniformly envelop the micromechanical component; and
   a cap affixed to the micromechanical component, wherein the cap has at least one structured surface having grooves running in a direction of the material flow to guide the material flow.

2. The micromechanical component of claim 1, further comprising:
   a micromechanical element having a cap, whose surface is adapted to flow the material from the at least one preferred direction.

3. The micromechanical component of claim 2, wherein the cap includes at least one beveled edge for guiding the material flow.

4. The micromechanical component of claim 3, wherein the cap includes the at least one beveled edge for guiding the material flow, on a side facing away from the source of the material flow.

5. The micromechanical component of claim 1, wherein the micromechanical component includes a lead frame, and the lead frame includes at least one structured surface for guiding the material flow.

6. The micromechanical component of claim 1, wherein the micromechanical component includes a lead frame, and the lead frame includes at least one port for guiding the material flow.

7. The micromechanical component of claim 6, wherein:
   the micromechanical component has a micromechanical element and the another element,
   the micromechanical element and the another element are situated on the lead frame, and
   the at least one port is situated in the lead frame between the micromechanical element and the another element.

8. The micromechanical component of claim 7, wherein the another element is a microelectronic circuit.

9. A sheathed micromechanical component of claim 1, further comprising:
   a gating point which determines an origin and the preferred direction of the material flow.

10. The micromechanical component of claim 1, further comprising:
    micromechanical element having a cap, whose surface is adapted to flow the material from the at least one preferred direction; and
    a gating point which determines an origin and the preferred direction of the material flow;
    wherein the cap includes at least one beveled edge for guiding the material flow.

11. The micromechanical component of claim 10, wherein:
    the micromechanical component has a micromechanical element and another element,
    the micromechanical element and the additional element are situated on the lead frame, and
    the at least one port is situated in the lead frame between the micromechanical element and the another element.

12. The micromechanical component of claim 11, wherein the cap includes the at least one beveled edge for guiding the material flow, on a side facing away from the source of the material flow.

13. The micromechanical component of claim 12, wherein the another element is a microelectronic circuit.

14. A sheathed micromechanical component, comprising:
at least one of a lead frame and a micromechanical element, and affixed to it a cap; and
a gating point,
wherein at least one of the following is satisfied:
the cap has at least one beveled edge,
the cap has at least one structured surface having grooves, and
an additional element is affixed to the lead frame and the lead frame has a port situated between the micromechanical element and an additional element.

15. The sheathed micromechanical component of claim 14, wherein the cap has at least one beveled edge, on a side facing away from the gating point.

16. The sheathed micromechanical component of claim 14, wherein:
the surface of the cap is adapted to flow a material from at least one preferred direction,
a gating point determines an origin and the preferred direction of the material flow, and
the cap includes the at least one beveled edge for guiding the material flow.

17. The sheathed micromechanical component of claim 13, wherein:
the micromechanical component has a micromechanical element and another element,
the micromechanical element and the additional element are situated on the lead frame, and
the at least one port is situated in the lead frame between the micromechanical element and the another element.

18. The sheathed micromechanical component of claim 17, wherein the cap includes the at least one beveled edge for guiding the material flow, on a side facing away from the source of the material flow.

19. The sheathed micromechanical component of claim 18, wherein the another element is a microelectronic circuit.

* * * * *